US009263439B2

(12) United States Patent
Zhang

(10) Patent No.: US 9,263,439 B2
(45) Date of Patent: Feb. 16, 2016

(54) III-NITRIDE SWITCHING DEVICE WITH AN EMULATED DIODE

(75) Inventor: Jason Zhang, Monterey Park, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 7 days.

(21) Appl. No.: 12/800,902

(22) Filed: May 24, 2010

(65) Prior Publication Data

US 2011/0284862 A1 Nov. 24, 2011

(51) Int. Cl.
*H01L 27/06* (2006.01)
*H01L 27/085* (2006.01)
*H03K 17/687* (2006.01)
*H01L 21/8252* (2006.01)

(52) U.S. Cl.
CPC .......... *H01L 27/085* (2013.01); *H01L 21/8252* (2013.01); *H01L 27/0605* (2013.01); *H03K 17/687* (2013.01)

(58) Field of Classification Search
USPC ........... 257/192, 194, 195, E29.246, E29.253
See application file for complete search history.

(56) References Cited

U.S. PATENT DOCUMENTS

| 5,341,007 | A | * | 8/1994 | Kuwata | 257/194 |
|---|---|---|---|---|---|
| 5,455,758 | A | * | 10/1995 | Pelly | 363/47 |
| 5,969,513 | A | * | 10/1999 | Clark | 323/282 |
| 5,973,367 | A | * | 10/1999 | Williams | 257/365 |
| 6,486,056 | B2 | * | 11/2002 | Pasch et al. | 438/622 |
| 6,992,319 | B2 | * | 1/2006 | Fahimulla et al. | 257/20 |
| 2002/0076851 | A1 | * | 6/2002 | Eden et al. | 438/106 |
| 2005/0184317 | A1 | | 8/2005 | Hatakeyama et al. | |
| 2005/0189561 | A1 | * | 9/2005 | Kinzer et al. | 257/192 |
| 2005/0189562 | A1 | * | 9/2005 | Kinzer et al. | 257/192 |
| 2007/0018247 | A1 | * | 1/2007 | Brindle et al. | 257/347 |

(Continued)

FOREIGN PATENT DOCUMENTS

| JP | H9-223799 | 8/1997 |
|---|---|---|
| JP | 2008-21930 | 1/2008 |

(Continued)

OTHER PUBLICATIONS

Lanford et al., Recessed-Gate Enhancement-mode GaN HEMT with High Threshold Voltage, Mar. 31, 2005, Electronic Letters, vol. 41 No. 7.*

(Continued)

*Primary Examiner* — Mark Tornow
*Assistant Examiner* — Abbigale Boyle
(74) *Attorney, Agent, or Firm* — Farjami & Farjami LLP

(57) ABSTRACT

Some exemplary embodiments of a III-nitride switching device with an emulated diode have been disclosed. One exemplary embodiment comprises a GaN switching device fabricated on a substrate comprising a high threshold GaN transistor coupled across a low threshold GaN transistor, wherein a gate and a source of the low threshold GaN transistor are shorted with an interconnect metal to function as a parallel diode in a reverse mode. The high threshold GaN transistor is configured to provide noise immunity for the GaN switching device when in a forward mode. The high threshold GaN transistor and the low threshold GaN transistor are typically fabricated on the same substrate, and with significantly different thresholds. As a result, the superior switching characteristics of III-nitride devices may be leveraged while retaining the functionality and the monolithic structure of the inherent body diode in traditional silicon FETs.

18 Claims, 5 Drawing Sheets

(56) References Cited

U.S. PATENT DOCUMENTS

| | | | |
|---|---|---|---|
| 2008/0122418 A1* | 5/2008 | Briere et al. | 323/282 |
| 2009/0032820 A1* | 2/2009 | Chen | 257/76 |
| 2009/0051225 A1* | 2/2009 | Yang et al. | 307/113 |
| 2009/0072269 A1* | 3/2009 | Suh et al. | 257/136 |
| 2009/0166677 A1 | 7/2009 | Shibata et al. | |
| 2009/0201072 A1* | 8/2009 | Honea et al. | H03K 17/08142 327/424 |
| 2010/0019279 A1 | 1/2010 | Chen et al. | |
| 2011/0261590 A1* | 10/2011 | Liu | 363/17 |

FOREIGN PATENT DOCUMENTS

| | | |
|---|---|---|
| JP | 2008-91394 | 4/2008 |
| JP | 2009-164158 | 7/2009 |
| WO | WO 2007145279 A1 * | 12/2007 |

OTHER PUBLICATIONS

Lanford et al., Recessed-Gate enhancement-mode GaN HEMT with high threshold voltage, Electronic Letters vol. 41 No. 7, Mar. 31, 2005.*

* cited by examiner

US 9,263,439 B2

III-NITRIDE SWITCHING DEVICE WITH AN EMULATED DIODE

DEFINITION

In the present application, "III-nitride" refers to a compound semiconductor that includes nitrogen and at least one group III element, such as, but not limited to, GaN, AlGaN, InN, AlN, InGaN, InAlGaN and the like.

BACKGROUND OF THE INVENTION

1. Field of the Invention

The present invention relates generally to transistors and switching circuits. More particularly, the present invention relates to III-nitride transistors and switching circuits.

2. Background Art

Silicon based transistors such as silicon metal-oxide-semiconductor field-effect transistors or MOSFETs may include the advantageous property of a body diode or an "intrinsic diode" due to their inherent silicon PN junctions. This "intrinsic diode" provides advantages such as inherent over-voltage (or under-voltage) protection for power conversion circuits without requiring a separate diode; thus reducing costs, improving efficiency, and simplifying circuit design.

On the other hand, III-nitride transistors such as gallium nitride high electron mobility transistors or GaN HEMTs are often preferable over traditional silicon based transistors for switching, and especially high voltage switching, applications. By providing higher breakdown voltage, higher temperature operation, reduced specific on-resistance, and other desirable traits, III-nitride transistors are especially suited for high power and high frequency switching applications such as efficient DC-DC power conversion circuits.

Unfortunately, since the "intrinsic diode" is only the result of a silicon FET structure, III-nitride transistors require a separate diode to provide the same benefits as the "intrinsic diode" in silicon transistors. However, integrating a monolithic diode in a GaN HEMT process is difficult and complex. Moreover, for high performance switching applications, the need for Schottky-like diode performance with low forward voltage drop and zero reverse recovery characteristics further complicates monolithic integration into a single device. Thus, while high performance III-nitride switching transistors are readily available, adoption is not yet as widespread in power conversion applications due to the lack of suitable methods to integrate a high performance diode with Schottky-like characteristics.

Thus, a solution is needed to provide III-nitride transistors such as GaN HEMTs with high performance Schottky-like diode functionality that is practical and not prohibitively complex or costly.

SUMMARY OF THE INVENTION

A III-nitride switching device with an emulated diode, substantially as shown in and/or described in connection with at least one of the figures, as set forth more completely in the claims.

DETAILED DESCRIPTION OF THE INVENTION

The present application is directed to a III-nitride switching device with an emulated diode. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
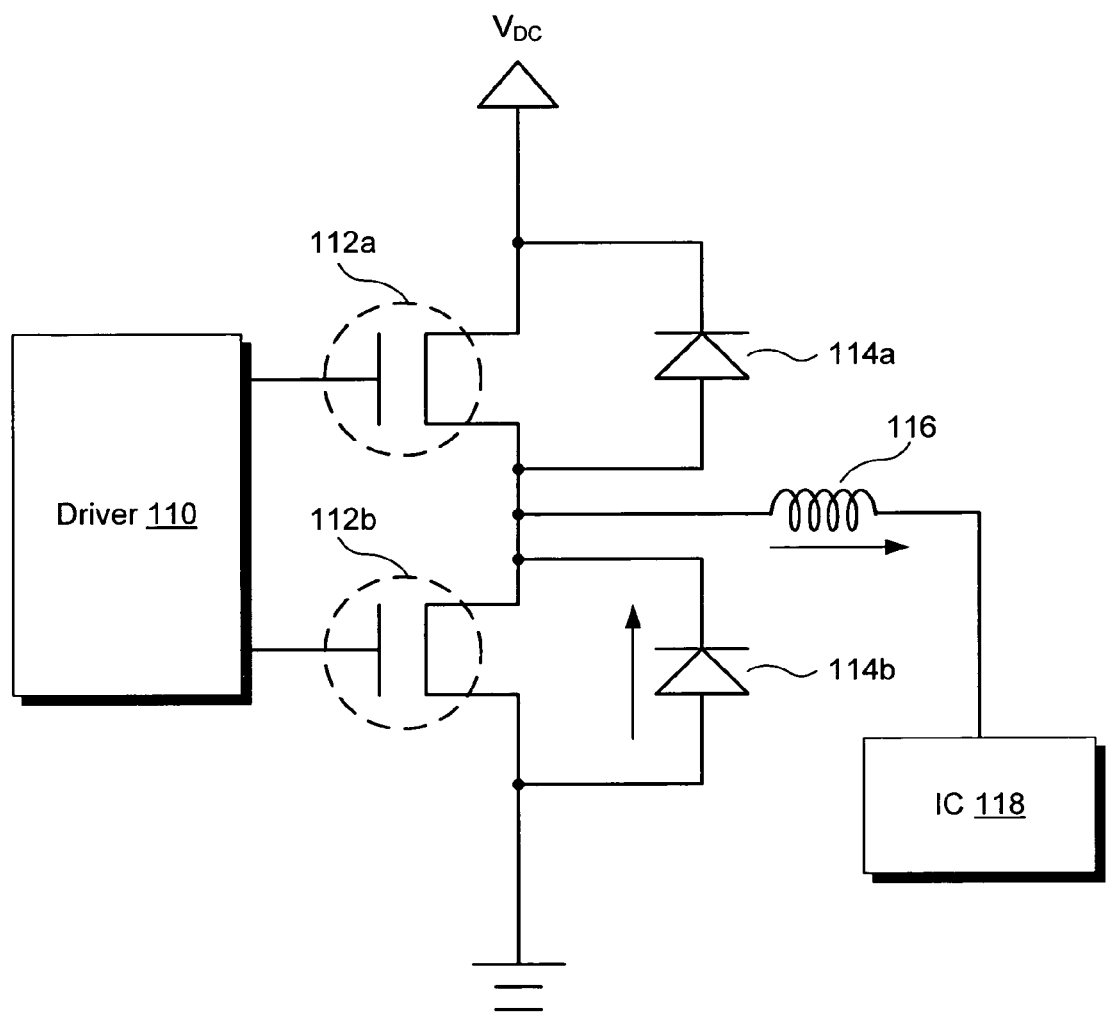
FIG. 1 illustrates a schematic diagram of an exemplary half bridge circuit for DC power conversion using GaN switches.

FIG. 1 illustrates a schematic diagram of an exemplary half bridge circuit for DC power conversion using GaN switches. Driver 110, GaN switch 112a, GaN switch 112b, diode 114a, diode 114b, inductor 116, and integrated circuit (IC) 118 are indicated in FIG. 1. The half bridge circuit in FIG. 1 may, for example, convert a provided $V_{DC}$ voltage to a suitable DC voltage required by IC 118. As shown by the orientation of diodes 114a and 114b, the diodes are configured as reverse parallel or anti-parallel diodes with respect to GaN switches 112a and 112b. Arrows adjacent to diode 114b and inductor 116 indicate the flow of current during a portion of "dead time."

As discussed in the background, III-nitride transistors lack the "inherent diode" of silicon transistors. Thus, III-nitride transistors such as GaN switch 112a and GaN switch 112b in the half-bridge circuit configuration shown in FIG. 1 require the addition of separate diodes 114a and 114b for diode functionality. Such functionality may include "over-voltage protection" for GaN switches 112a and 112b when in the reverse mode (the protection provided might also be called "under-voltage protection" in some circumstances, but for simplicity, the phrase "over-voltage protection" is only used in the present application, which refers to both over-voltage and under-voltage protection collectively).

For example, assume that the circuit shown in FIG. 1 is currently in the dead time wherein GaN switches 112a and 112b are both open or in the off state. Since the current flow to the inductive load through inductor 116 is suddenly interrupted by the dead time, a large voltage spike normally results in the reverse direction. Focusing in particular on GaN switch 112b, if diode 114b were absent, the inductive load current would normally be drawn from and cause breakdown and destruction of GaN switch 112b. However, if diode 114b is present as shown in FIG. 1, the current can instead be drawn from diode 114b, thereby providing "over-voltage protection" (or more accurately "under-voltage protection" in this case) for GaN switch 112b in the reverse mode. Diode 114a may also provide "over-voltage protection" for GaN switch 112a in a similar manner.

Figure 2:
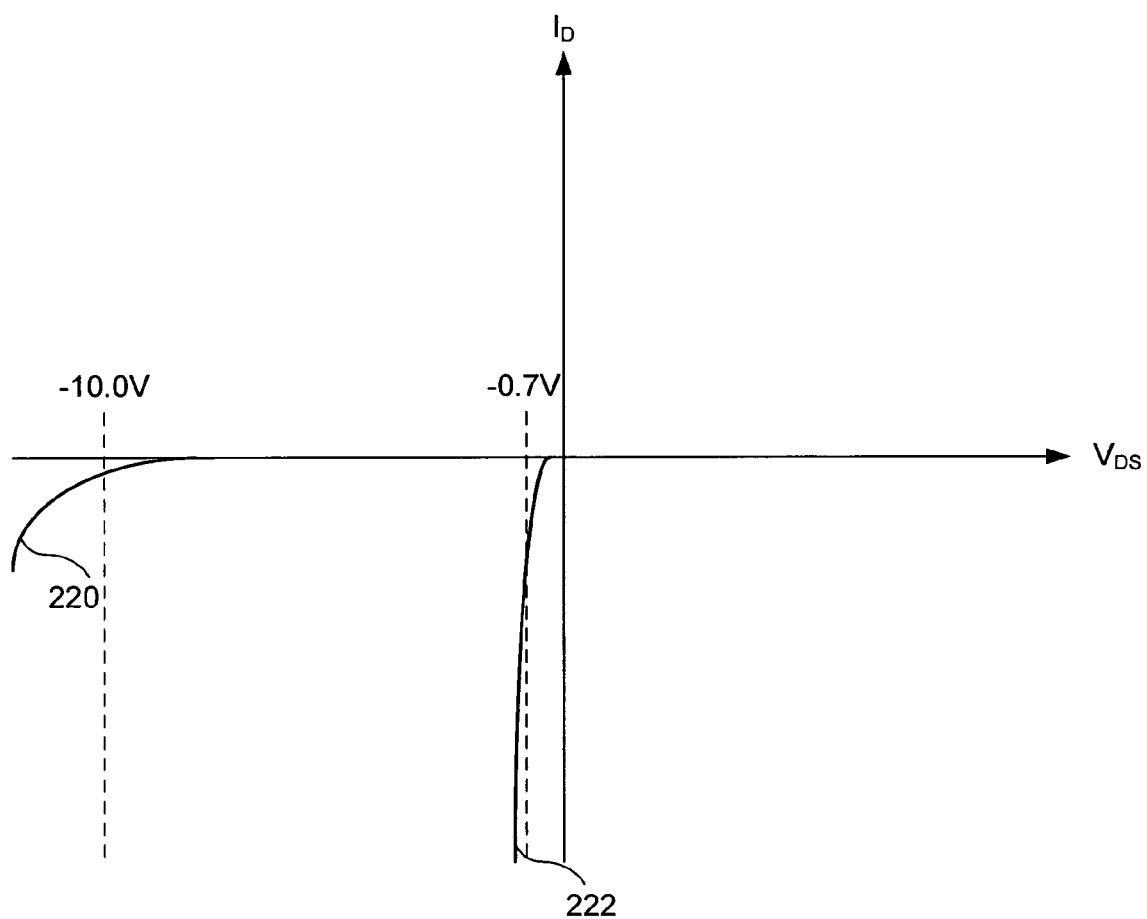
FIG. 2 illustrates a current to voltage (IV) graph for an exemplary GaN switch.

FIG. 2 illustrates a current to voltage (IV) graph for an exemplary GaN switch (FIG. 2 is not drawn to scale). The X-axis ($V_{DS}$) represents voltage across the drain and source of the switch, and the Y-axis ($I_D$) represents the current flowing through the drain of the switch. Focusing on quadrant III, or the behavior of the switch in the reverse mode, IV curve 220 and IV curve 222 are shown in FIG. 2. IV curve 220 corresponds to the switch behavior without a diode, and IV curve 222 corresponds to the switch behavior with a diode. The GaN switch may, for example, comprise a depletion mode (D-mode) GaN switch. However, the principles discussed in conjunction with FIG. 2 apply similarly to enhancement mode (E-mode) GaN switches as well.

For example, $V_{GS}$, the gate drive voltage in the reverse mode or quadrant III, may be −12V. The voltage drop or $V_F$ in the reverse mode may be calculated using the equation $V_F=Vth-V_{GS}$, or threshold voltage minus gate drive voltage. Assuming a threshold voltage Vth of −2, the voltage drop $V_F=-2-(-12)=10V$. In this case, the IV curve for the GaN switch may appear similar to IV curve 220. As shown in the example of quadrant III of FIG. 2, the voltage for IV curve 220 is generally −10.0V or more. This VF voltage (10V) is too large to be considered as a diode equivalent, where the VF is typically about 0.7V. Moreover, as the formula for electrical power P=I*V indicates, the large voltage drop of 10V undesirably results in a very high power consumption. While the threshold voltage of the switching device may be calibrated higher to offset the voltage drop, the penalty to switching performance may outweigh any potential benefits.

On the other hand, if a reverse parallel diode is provided for the GaN switch, the corresponding IV curve may appear more similar to IV curve 222. Since the current is instead routed through the diode, which may have a low Schottky-like voltage drop such as $V_F=0.7$ volts or lower, the high voltage condition is avoided, thereby providing over-voltage protection for the GaN switch. However, as discussed above, it is difficult and complex to integrate a monolithic diode for the GaN switching transistor. Without integrating the diode with the transistor, the benefits of switching from silicon FETs to III-nitride HEMTs may be largely nullified. Thus, due to diode integration difficulties, it is difficult to attain a GaN switch suitable for high voltage operation that exhibits desirable quadrant III behavior similar to IV curve 222.

Figure 3:
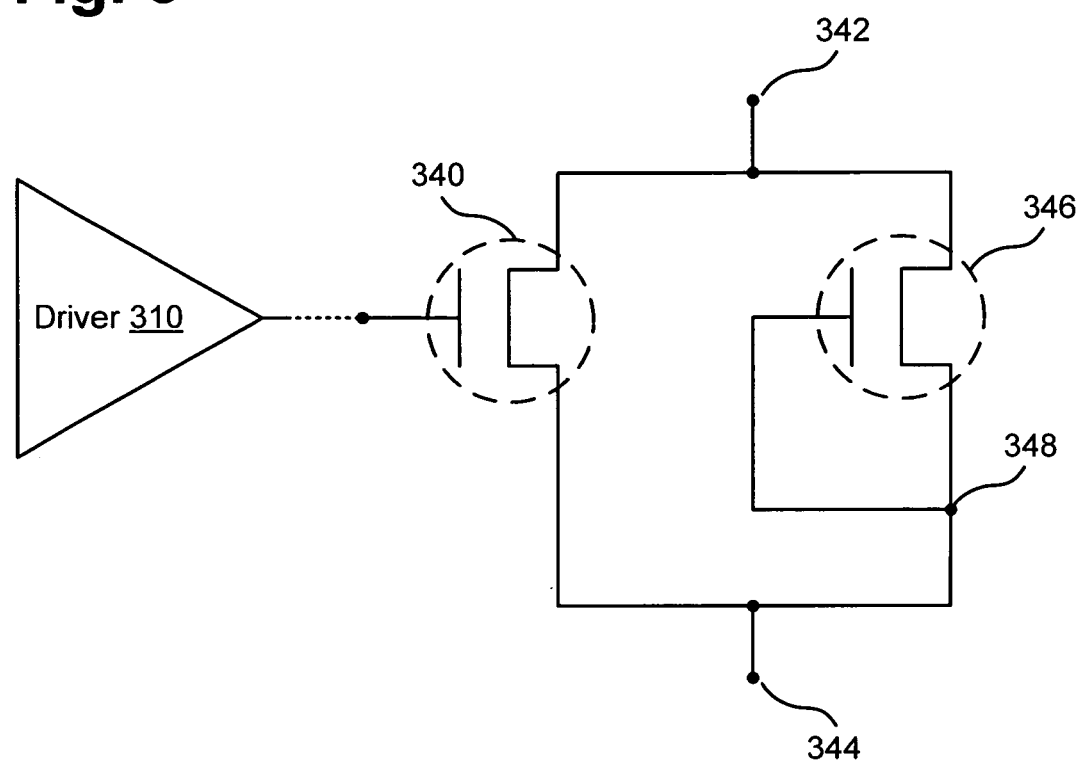
FIG. 3 illustrates a schematic diagram of an enhancement mode GaN switch with an emulated diode, according to an embodiment of the invention.

FIG. 3 illustrates a schematic diagram of an enhancement mode GaN switch with an emulated diode, according to an embodiment of the invention. Driver 310, high threshold GaN transistor 340, low threshold GaN diode connected transistor 346, drain node 342, source node 344, and common node 348 are shown in FIG. 3. In the present embodiment, high threshold GaN transistor 340 and low threshold GaN diode connected transistor 346 each comprise an E-mode GaN HEMT. It should be noted that FIG. 3 is only illustrative and alternative embodiments using D-mode GaN HEMTs or a combination of E-mode and D-mode GaN HEMTs are also possible. The terms "low threshold" and "high threshold" refer to the threshold voltages of each respective transistor and their relative values. The term "diode connected" for low threshold GaN diode connected transistor 346 refers to the configuration where the source is shorted to the gate at common node 348 to provide a parallel diode, as shown in FIG. 3. For example, an interconnect metal with very low resistance may be utilized to short the source and gate of low threshold GaN diode connected transistor 346.

As shown in FIG. 3, low threshold GaN diode connected transistor 346 is coupled across high threshold GaN transistor 340. More specifically, the drain of high threshold GaN transistor 340 is shorted to the drain of low threshold GaN diode connected transistor 346, and the source of high threshold GaN transistor 340 is shorted to the source of low threshold GaN diode connected transistor 346.

Focusing specifically on low threshold GaN diode connected transistor 346, since the GaN transistor, the voltage drop $V_F=Vth-V_{GS}$. However, since the GaN transistor is "diode connected" where the gate is shorted to the source with low resistance, $V_{GS}$ simplifies to zero, and the voltage drop is simply equal to the threshold voltage, Vth. Thus, by configuring Vth to be low, such as approximately 0.7 volts or less, a sufficient low voltage drop may be provided to emulate a diode in the reverse mode. Since the low Vth leaves a very small noise margin, it is important that the shorting of the gate to the source have as little resistance as possible, for example by using an interconnect metal as described above. Thus, with a suitably low Vth and a very low resistance connection between gate and source, a Schottky-like diode performance can be achieved.

Unfortunately, a transistor with very low Vth characteristics may be unsuitable for switching, particularly for high voltage applications. Without a sufficiently high Vth such as approximately 3 volts or greater, certain desirable circuit properties such as sufficient noise immunity for high voltage circuit operation may not be realized. For example, assuming source node 344 is connected to ground, the voltage at drain node 342 can be between 40 and 600 volts. Moreover, driver 310 may drive high threshold GaN transistor 340 with a gate drive voltage between 0 and 12 volts. To support such high voltages, high threshold GaN transistor 340 should be configured with a relatively high threshold voltage such as approximately 3 volts or higher compared to low threshold GaN diode connected transistor 346 which may have a relatively low threshold voltage such as approximately 0.7 volts or less.

High threshold GaN transistor 340 and low threshold GaN diode connected transistor 346 typically require close proximity or monolithic integration into a single switching device to provide an efficient low resistance circuit leveraging the high performance switching properties of III-nitride transistors such as GaN/AlGaN HEMTs. For example, high threshold GaN transistor 340 and low threshold GaN diode connected transistor 346 may be formed on the same device substrate, which may comprise, for example, a GaN substrate, a silicon carbide substrate, an alumina substrate, or a silicon only substrate. To optimize the device form factor, high threshold GaN transistor 340, responsible for switching in forward mode, may comprise a significantly larger surface area of the device compared to low threshold GaN diode connected transistor 346, which is only responsible for diode functionality in the reverse mode. More specifically, a surface area ratio between high threshold GaN transistor 340 and low threshold GaN diode connected transistor 346 may greater than approximately 9:1.

Due to the close proximity of the transistors, it is difficult to prevent one transistor from affecting the threshold voltage of the other transistor. However, by using appropriate masking processes and various techniques to modify transistor threshold voltage, a sufficient threshold voltage difference can be achieved between low threshold GaN-diode connected transistor 346 and high threshold GaN transistor 340. For example, after forming and masking low threshold GaN diode connected transistor 346, the threshold voltage of GaN transistor 340 may be modified to achieve a high threshold voltage. By interrupting the 2-DEG conduction channel in GaN transistor 340, a higher threshold voltage may thus be achieved. For example, one method of interrupting the 2-DEG conduction channel comprises forming a recess under the gate of the transistor. Another method comprises trapping charges in the gate region of the transistor. The charges can be formed and/or trapped in for example, the gate electrode, the gate dielectric under the gate electrode, and even the semiconductor region under the gate dielectric. By creating such a dual threshold switch device as shown in FIG. 3, diode functionality for over-voltage protection in reverse mode and noise immunity for high voltage operation in forward mode may be achieved.

Figure 4:
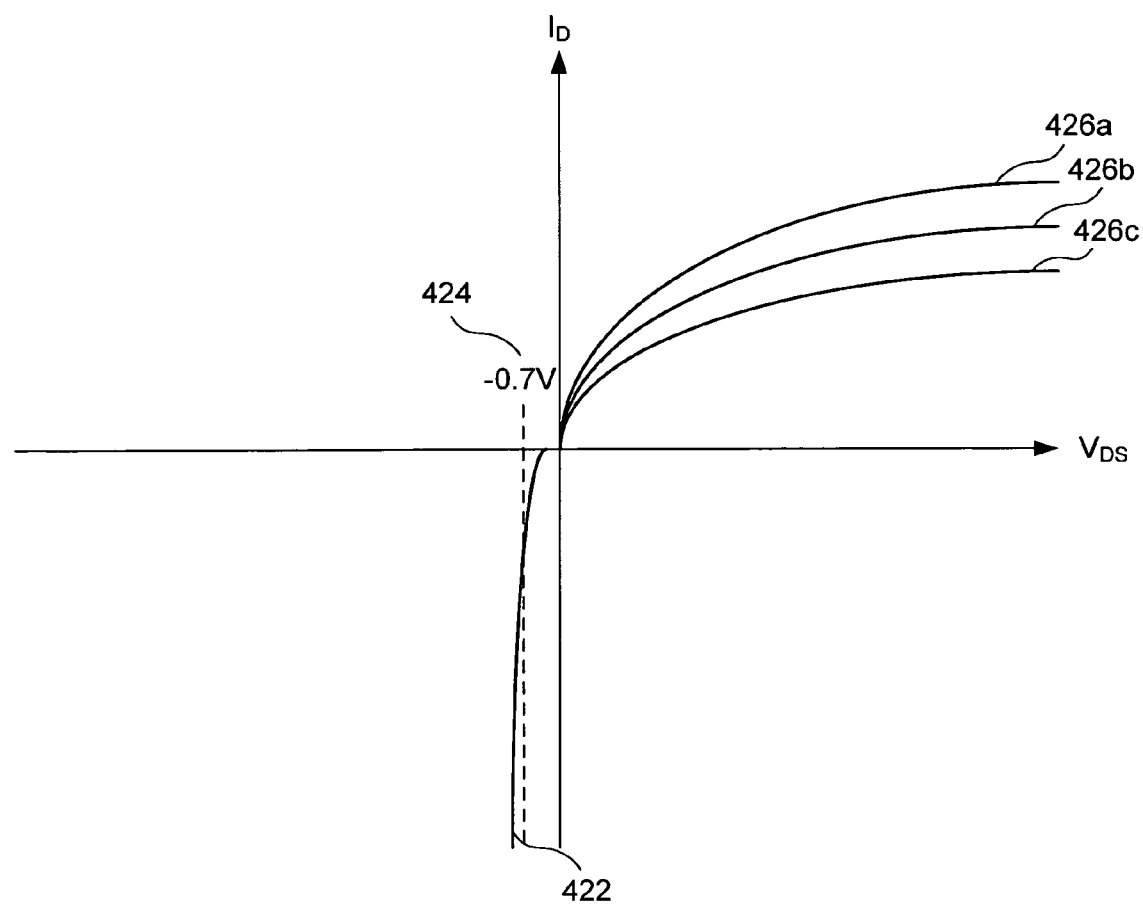
FIG. 4 illustrates a current to voltage (IV) graph for an enhancement mode GaN switch with an emulated diode, according to an embodiment of the invention.

FIG. 4 illustrates a current to voltage (IV) graph for an enhancement mode GaN switch with an emulated diode, according to an embodiment of the invention (FIG. 4 is not drawn to scale). The X-axis ($V_{DS}$) represents voltage across the drain and source of the switch, and the Y-axis ($I_D$) represents the current flowing through the drain of the switch. In quadrant III, IV curve 422 is shown for the reverse mode. In quadrant I, IV curves 426a, 426b, and 426c are shown for the forward mode, each representing different $V_{GS}$ or gate drive voltages. The IV graph shown in FIG. 4 may correspond to the device shown in the schematic diagram of FIG. 3.

As shown in quadrant III of FIG. 4, IV curve 422 has a very low voltage drop in the reverse mode of 0.7 volts or less, as shown by Vth 424. Vth 424 may, for example, correspond to the Vth of low threshold GaN diode connected transistor 346. Thus, the GaN switch is protected against over-voltage in the reverse mode.

As shown in quadrant I of FIG. 4, IV curves 426a, 426b, and 426c each corresponds to a different gate drive voltage or $V_{GS}$ in the forward mode. Thus, the device can be flexibly configured for high voltage applications by adjusting the gate drive voltage. By configuring the Vth of high threshold GaN transistor 340 to a suitably high value, such as approximately 3 volts or greater, noise immunity can be provided for the forward mode operation of the GaN switch in quadrant I.

Figure 5:
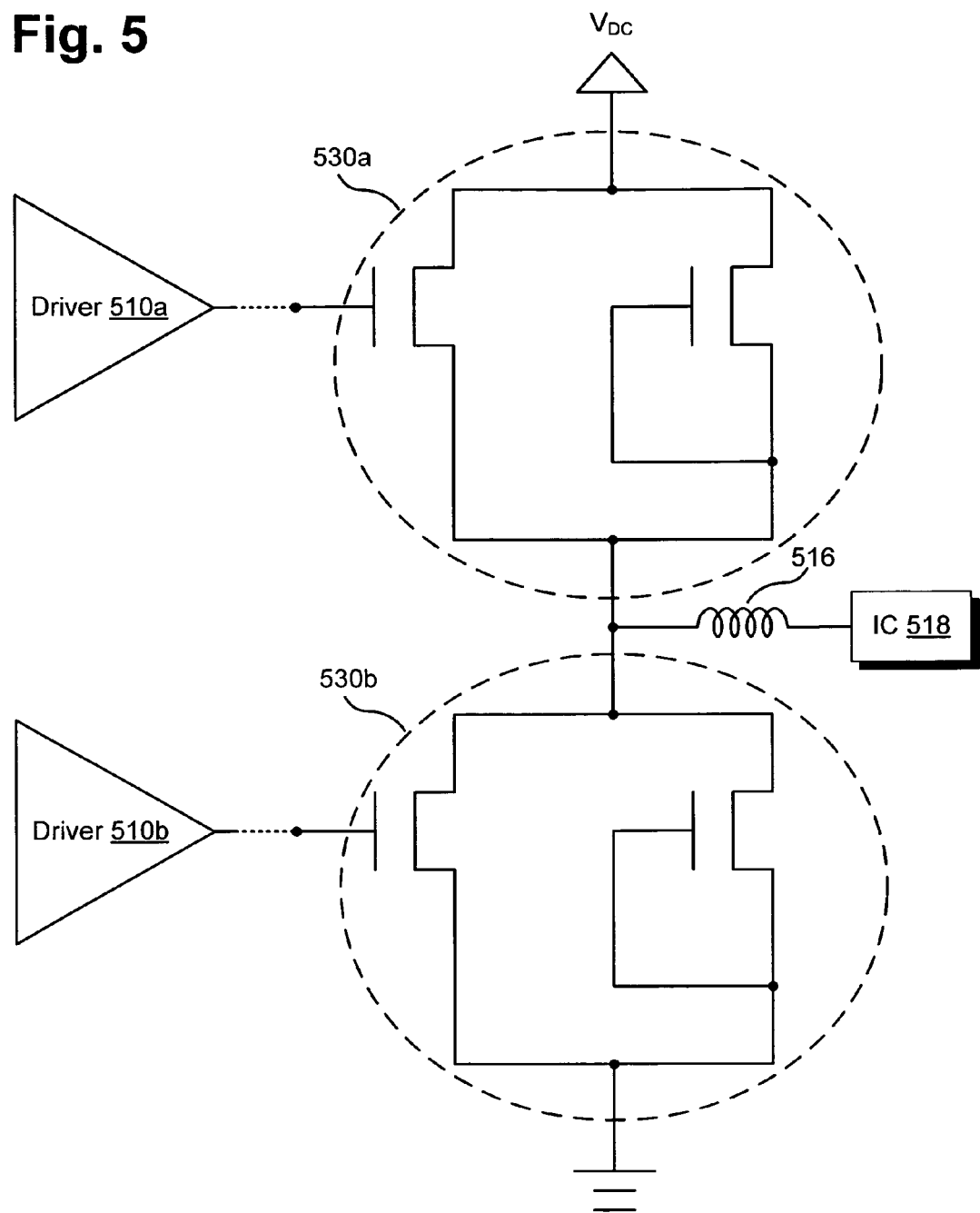
FIG. 5 illustrates a schematic diagram of enhancement mode GaN switches with emulated diodes integrated into a half-bridge circuit, according to an embodiment of the invention.

FIG. 5 illustrates a schematic diagram of enhancement mode GaN switches with emulated diodes integrated into a half-bridge circuit, according to an embodiment of the invention. Driver 510a, driver 510b, GaN switching device 530a, GaN switching device 530b, inductor 516, and IC 518 are shown in FIG. 5. GaN switching device 530a and driver 510a may correspond to the device shown in the schematic diagram of FIG. 3. GaN switching device 530b and driver 510b may also correspond to the device shown in the schematic diagram of FIG. 3.

As shown in FIG. 5, the half-bridge circuit may provide efficient DC-DC conversion for IC 518 using inductor 516 and GaN switching devices 530a and 530b, which each include the emulated diode according to the present invention. As a result, the superior switching characteristics of III-nitride transistors such as GaN HEMTs may be leveraged while still providing the over-voltage protection that was conventionally provided by silicon FETs having inherent body diodes.

Thus, a III-nitride device with an emulated diode has been described. The invention's switching device with dual threshold transistors provides the switching advantages of III-nitride transistors with the over-voltage protection and the monolithic structure provided by an integrated diode (for example, the body diode) in silicon only technologies. These benefits are of particular interest for high voltage power applications such as DC-DC power conversion circuits.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A III-nitride switching device comprising:
a high threshold III-nitride transistor for being switched by a driver circuit;
a low threshold III-nitride diode connected transistor coupled across said high threshold III-nitride transistor at a common source node and a common drain node, said low threshold III-nitride diode having a gate and a source, said gate being coupled to said source at said common source node;
wherein said high threshold III-nitride transistor comprises a high threshold voltage more than four times larger than a low threshold voltage of said low threshold III-nitride diode connected transistor, and provides noise immunity for said III-nitride switching device in a forward mode;
wherein a low resistance interconnect metal connects said gate and said source of said low threshold III-nitride diode connected transistor so that said low threshold voltage of said low threshold III-nitride diode is substantially equal to a voltage drop of said low threshold III-nitride diode in a reverse mode;
wherein said low threshold III-nitride diode connected transistor functions as a parallel diode for protection of said III-nitride switching device in said reverse mode;
wherein said III-nitride switching device comprises a combination of E-mode and D-mode GaN HEMTs.

2. The III-nitride switching device of claim 1, wherein said high threshold III-nitride transistor comprises an E-mode GaN HEMT.

3. The III-nitride switching device of claim 1, wherein said low threshold III-nitride diode connected transistor comprises an E-mode GaN HEMT.

4. The III-nitride switching device of claim 1, wherein said gate and said source of said low threshold III-nitride diode connected transistor are shorted by said low resistance interconnect metal such that said low threshold III-nitride diode connected transistor functions as said parallel diode.

5. The III-nitride switching device of claim 1, wherein said high threshold III-nitride transistor is formed by interrupting a 2-DEG conduction channel in said high threshold III-nitride transistor.

6. The III-nitride switching device of claim 5, wherein said 2-DEG conduction channel is interrupted by trapping charges in a gate region of said high threshold III-nitride transistor.

7. The III-nitride switching device of claim 5, wherein said 2-DEG conduction channel is interrupted by forming a recess under a gate of said high threshold III-nitride transistor.

8. The III-nitride switching device of claim 1, wherein said III-nitride switching device is utilized as a switch in a half-bridge circuit.

9. The III-nitride switching device of claim 1, wherein said driver circuit switches said high threshold III-nitride transistor with a voltage between approximately 0 and 12 volts, and wherein a voltage across a drain and a source of said high threshold III-nitride transistor is between approximately 40 and 600 volts.

10. A GaN switching device comprising:
a high threshold GaN transistor fabricated on a substrate;
a low threshold GaN diode connected transistor fabricated on said substrate;
wherein a high threshold voltage of said high threshold GaN transistor is more than four times larger than a low threshold voltage of said low threshold GaN diode connected transistor;
wherein a gate and a source of said low threshold GaN diode connected transistor are shorted by a low resistance interconnect metal such that said low threshold voltage of said low threshold GaN diode connected transistor is substantially equal to a voltage drop of said low threshold GaN diode connected transistor in a reverse mode to function as a parallel diode;
a drain of said high threshold GaN transistor being shorted to a drain of said low threshold GaN diode connected transistor, and a source of said high threshold GaN transistor being shorted to said source of said low threshold GaN diode connected transistor;
wherein said GaN switching device comprises a combination of E-mode and D-mode GaN HEMTs.

11. The GaN switching device of claim 10, wherein said high threshold GaN transistor provides noise immunity for said GaN switching device in a forward mode.

12. The GaN switching device of claim 10, wherein said low threshold GaN diode connected transistor functions as a parallel diode for protection of said GaN switching device in said reverse mode.

13. The GaN switching device of claim 10, wherein said substrate is selected from the group consisting of a GaN substrate, a silicon carbide substrate, an alumina substrate, and a silicon only substrate.

14. The GaN switching device of claim 10, wherein said high threshold GaN transistor is formed by interrupting a 2-DEG conduction channel in said high threshold GaN transistor.

15. The GaN switching device of claim 14, wherein said 2-DEG conduction channel is interrupted by trapping charges in a gate region of said high threshold GaN transistor.

16. The GaN switching device of claim 14, wherein said 2-DEG conduction channel is interrupted by forming a recess under a gate of said high threshold GaN transistor.

17. The GaN switching device of claim 10, wherein a threshold voltage of said high threshold GaN transistor is greater than approximately 3 volts.

18. The GaN switching device of claim 10, wherein a threshold voltage of said low threshold GaN diode connected transistor is less than approximately 0.7 volts.

* * * * *